(12) United States Patent
Silva et al.

(10) Patent No.: US 8,928,449 B2
(45) Date of Patent: Jan. 6, 2015

(54) AC/DC PLANAR TRANSFORMER

(75) Inventors: Arturo Silva, Allen, TX (US); Neil Gayle, Austin, TX (US)

(73) Assignee: Flextronics AP, LLC, Broomfield, CO (US)

( * ) Notice: Subject to any disclaimer, the term of this patent is extended or adjusted under 35 U.S.C. 154(b) by 963 days.

(21) Appl. No.: 12/473,990

(22) Filed: May 28, 2009

(65) Prior Publication Data
US 2009/0295528 A1 Dec. 3, 2009

Related U.S. Application Data

(60) Provisional application No. 61/056,706, filed on May 28, 2008.

(51) Int. Cl.
| | |
|---|---|
| H01F 5/00 | (2006.01) |
| H01F 27/32 | (2006.01) |
| H01F 27/28 | (2006.01) |
| H01F 27/24 | (2006.01) |
| H01F 3/14 | (2006.01) |
| H01F 3/10 | (2006.01) |
| H01F 27/34 | (2006.01) |
| H01F 37/00 | (2006.01) |
| H01F 17/00 | (2006.01) |
| H05K 1/16 | (2006.01) |

(52) U.S. Cl.
CPC .. *H01F 3/14* (2013.01); *H01F 3/10* (2013.01); *H01F 27/346* (2013.01); *H01F 37/00* (2013.01); *H01F 2017/0093* (2013.01); *H05K 1/165* (2013.01)
USPC ........... 336/200; 336/84 R; 336/212; 336/182

(58) Field of Classification Search
None
See application file for complete search history.

(56) References Cited

U.S. PATENT DOCUMENTS

| | | | | |
|---|---|---|---|---|
| 5,559,487 | A * | 9/1996 | Butcher et al. | 336/178 |
| 5,598,135 | A * | 1/1997 | Maeda et al. | 336/200 |
| 6,000,128 | A * | 12/1999 | Umeno et al. | 29/846 |
| 6,278,353 | B1 * | 8/2001 | Downing et al. | 336/200 |
| 6,380,834 | B1 * | 4/2002 | Canzano et al. | 336/200 |
| 6,420,953 | B1 * | 7/2002 | Dadafshar | 336/200 |
| 6,636,140 | B2 * | 10/2003 | Fujiyoshi et al. | 336/200 |
| 7,145,427 | B2 * | 12/2006 | Yoshida et al. | 336/200 |
| 7,889,041 | B2 * | 2/2011 | Minteer | 336/200 |
| 2003/0095026 | A1 * | 5/2003 | Kawanobe | 336/200 |
| 2004/0032313 | A1 * | 2/2004 | Ferencz et al. | 336/200 |
| 2005/0128038 | A1 * | 6/2005 | Hyvonen | 336/182 |

FOREIGN PATENT DOCUMENTS

| | | |
|---|---|---|
| CN | 2092848 U | 1/1992 |
| CN | 2650300 Y | 10/2004 |
| JP | 2008-159403 | 7/2008 |

* cited by examiner

*Primary Examiner* — Mangtin Lian
(74) *Attorney, Agent, or Firm* — Haverstock & Owens LLP

(57) ABSTRACT

An inductive element including a magnetic core with a section received in a central opening defined in each of the layers in a multilayer circuit board. A primary winding, an auxiliary winding, and a secondary winding are each realized in conductive coils located on a plurality of layers in the circuit board. The secondary winding is separated from the other windings by a relatively-thick dielectric layer. Other dielectric layers separate each of the layers with the coils. EMI shields are provided on other layers. The coils are located in a central region of each layer so as to provide an adequate safety margin from the side edges of the inductive element.

10 Claims, 4 Drawing Sheets

AC/DC PLANAR TRANSFORMER

This application claims priority under 35 U.S.C. 119 to U.S. Provisional Application No. 61/056,706, entitled: "TECHNIQUES FOR POWER CONVERSION," filed on May 28, 2008, the contents of which are incorporated herein as if set forth in full.

BACKGROUND

Presented herein are techniques for use in power conversion devices. Generally, a power converter is a power supply unit that delivers energy to an electronic device, and may also regulate the current to meet the device's specific requirements. Power converters are commonly used in consumer electronics such as computers, laptops, audio equipment, cell phones, or the like.

One type of power converter is a Switched Mode Power Supplies (SMPS). An SMPS may include a power supply unit and a circuit inside the unit to regulate the current. The circuit moves extremely fast, regulating the current so that it can stabilize it to a set voltage that is then sent directly to the device. Because of weight, economic and convenience factors, SMPS are the device of choice to power most consumer electronics that need stable current and voltage. However, they must be designed carefully to provide power with acceptable efficiency and minimal noise.

To meet these requirements, power converters may include one or more stages that include one or more magnetic components including filters, transformers, inductors, or the like. Generally, the techniques described herein are directed to improvements in the various magnetic components that are utilized by power converters.

SUMMARY

The following embodiments and aspects of thereof are described and illustrated in conjunction with systems, tools, and methods which are meant to be exemplary and illustrative, and not limiting in scope. In various embodiments, one or more of the above-described problems have been reduced or eliminated, while other embodiments are directed to other improvements.

Disclosed is an inductive element that includes a multilayer circuit board wherein each layer of the board includes a central opening defined therein. A plurality of the layers in the board include a coil of conductive material thereon through which current can flow, and further wherein one or more of these coils constitute a primary winding and wherein one or more or more of these coils constitute a secondary winding. A plurality of other layers in the board serve as dielectric layers to separate the coils from each other, and to separate the primary winding from the secondary winding by an adequate safety margin. Pass-through leads in the board interconnect selected ones of the coils to create the primary and secondary windings. A magnetic core is also included, a portion of which is received within the central opening in the board.

The coils may be provided within a central area on the layers of the board to provide an adequate safety margin along the side edges of the board. A plurality of other layers may constitute EMI shields. The primary winding may be separated from the secondary winding by at least approximately 10 mils. The primary winding may be separated from the secondary winding by at least approximately 14 mils. The plurality of coils of the primary winding may be separated from each other by a dielectric layer having a thickness of less than approximately 5 mils. The plurality of coils of the primary winding may be separated from each other by a dielectric layer having a thickness of approximately 3 mils or less. The multilayer circuit board may be rectangular in shape with the rectangle having a length that is substantially greater than the width of the rectangle. The central opening may be oval-shaped. One or more of the coils may constitute an auxiliary winding.

Disclosed is an inductive element with a multilayer circuit board wherein each layer of the board includes a central opening defined therein. Included are at least the following layers in the following order: a first EMI shield layer; a first dielectric layer; a first coil layer of a primary winding; a second dielectric layer; a second coil layer of the primary winding; a third dielectric layer; a third coil layer of the primary winding; a fourth dielectric layer; a fourth coil layer of the primary winding; a fifth dielectric layer; a fifth coil layer of the primary winding; a sixth dielectric layer; a sixth coil layer of the primary winding; a seventh dielectric layer; a seventh coil layer of the primary winding; an eighth dielectric layer; an eighth coil layer of the primary winding; a ninth dielectric layer; a first coil layer of an auxiliary winding; a tenth dielectric layer; a second coil layer of the auxiliary winding; a second EMI shield layer; an eleventh dielectric layer that is substantially thicker than a majority of the other dielectric layers; a first coil layer of a secondary winding; an twelfth dielectric layer; a second coil layer of the secondary winding; a thirteenth dielectric layer; and a third EMI shield layer. Also included is a magnetic core, a portion of which is received within the central opening in the board.

In addition to the exemplary aspects and embodiments described above, further aspects and embodiments will become apparent by reference to the drawings and by study of the following descriptions.

DETAILED DESCRIPTION

Figure 1:
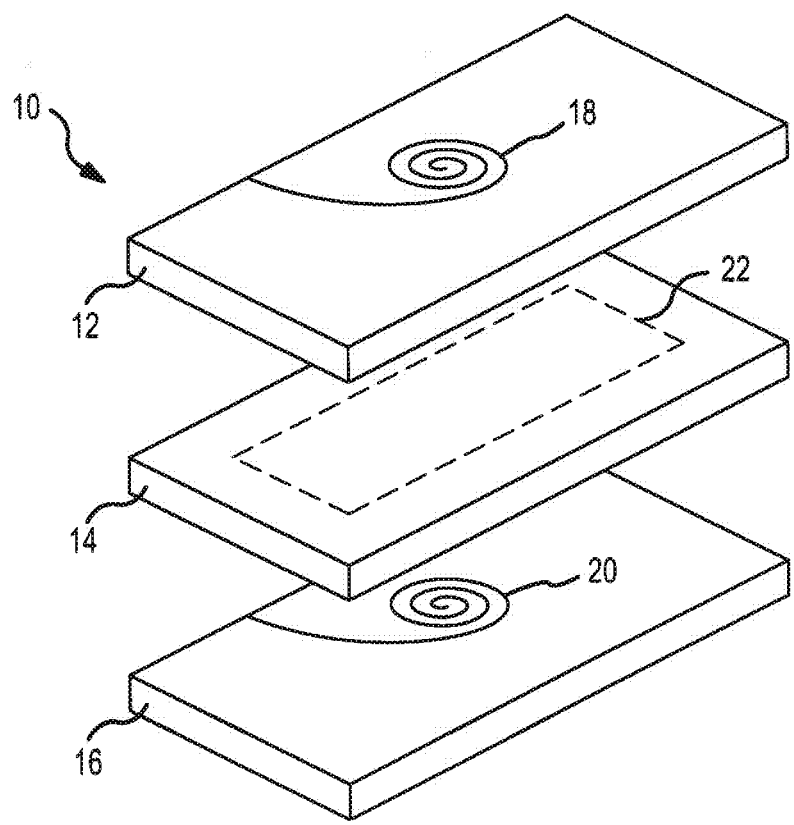
FIG. 1 is an exploded representation of a multilayer circuit board having a pair of windings on respective layers that are separated by an isolation layer.

While the invention is susceptible to various modifications and alternative forms, specific embodiments thereof have been shown by way of example in the drawings and are herein described in detail. It should be understood, however, that it is not intended to limit the invention to the particular form disclosed, but rather, the invention is to cover all modifications, equivalents, and alternatives falling within the scope and spirit of the invention as defined by the claims.

AC-to-DC converters generally require a high-voltage isolation barrier between the primary and secondary windings to conform to Underwriters Laboratories (UL) and international safety standards. For standard wound transformers, the isolation barrier is typically achieved either with margin tape wound between the primary and secondary windings, or by using triple insulated wire for either the primary or the secondary windings.

On the other hand, planar magnetic transformers are generally created by placing windings as traces on multilayer PC boards, and then adding a transformer core to the PC board. In planar transformers, it can be much harder to achieve the safety isolation barrier.

In current planar transformers, the primary and secondary windings may be created on separate PC boards. The PC boards are then either placed inside a high-insulation plastic shroud, or margin tape is placed around one or both boards prior to putting the PC boards together and adding the transformer core. However, this process is costly and labor intensive. Separately creating two PC boards and then having to attach them removes one of the driving factors for planar magnetics, which is related to the repeatability of transformer parameters for transformers made by a manufacturing process.

FIG. 1 shows portions of an inductive element (or transformer) 10 that includes at least three different layers 12, 14, and 16 of a circuit board. Layer 12 includes a coil 18 of conductive material that can constitute a primary winding. Layer 16 includes a coil 20 of conductive material that can constitute a secondary winding. Layer 14 is an insulative or isolation layer between the coils 18 and 20 on the layers 12 and 16 respectively. Dashed lines 22 on layer 14 show the area of the layers above and below that contain the coils 18 and 20. This illustrates the margin that is established between the coils 18 and 20 (particularly the coil 20 of the secondary winding) and the side edges of the inductive element 10. Of course, a magnetic core (not shown) may be provided and it may extend though openings (not shown) that may be defined in the layers 12, 14, and 16, so that the core passes through the center of the coils 18 and 20.

As can be seen, the PC board layers 12, 14, and 16 in the transformer 10 taught herein are laid out in such a way as to assure that there is adequate spacing between the primary and secondary layers, and the windings in at least the secondary layer are inset from the circuit board edges enough to provide adequate safety spacing. The end result is that a single circuit board is capable of supporting both the primary and secondary windings.

As one example of an adequate safety margin, UL™ standard 6950 specifies that secondary windings should be separated from other windings by at least a distance of 0.4 mm in the interior of a transformer and by at least a distance of 5 mm on the exterior of a transformer.

Figure 2:
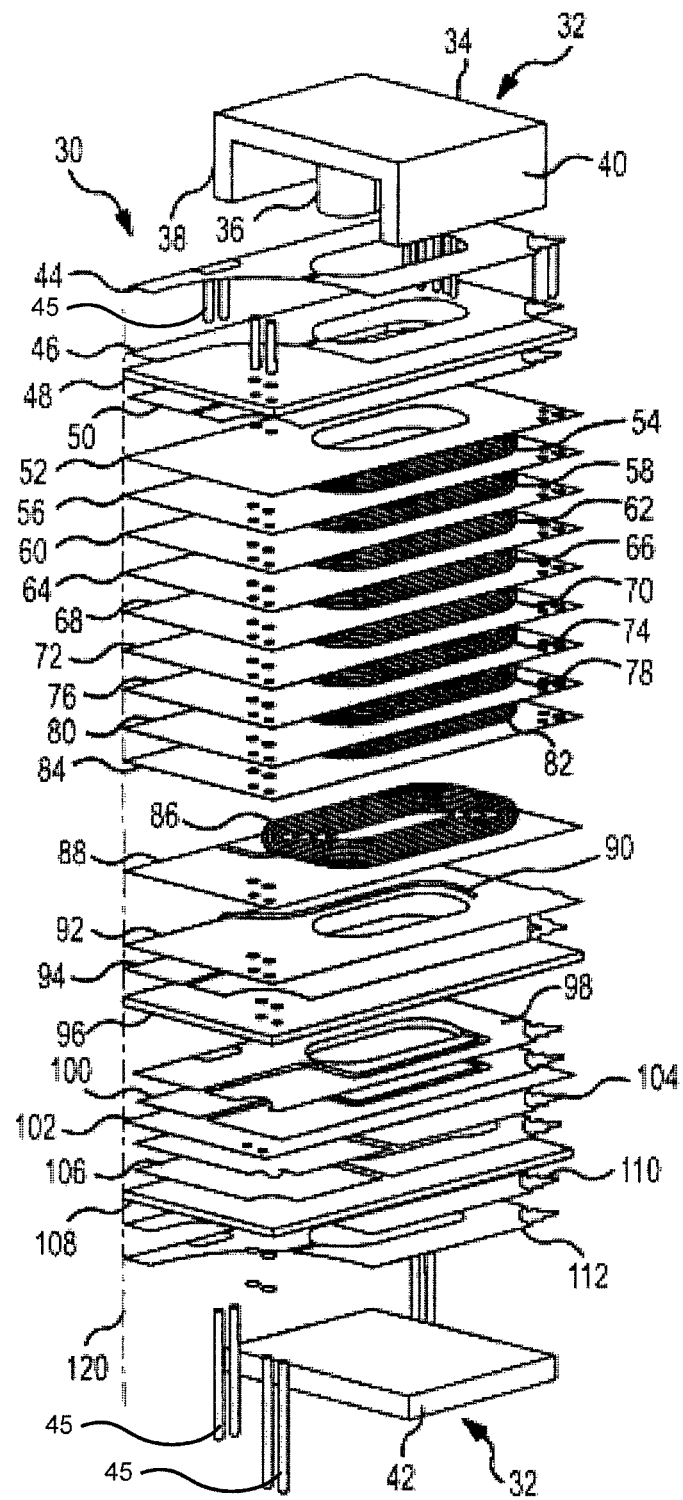
FIG. 2 shows an exploded view of a multilayer circuit board having a set of three windings distributed across several respective layers, with the secondary winding separated from the others by an isolation layer.

Further detail is shown in FIG. 2, which illustrates an inductive element 30 implemented in a circuit board with multiple layers. As can be seen, the inductive element 30 includes a magnetic core 32 made up of an upper section that includes a top wall 34, a center leg 36, and a pair of side walls 38 and 40, and a lower section made up of a bottom wall 42. When the inductive element is assembled, the center leg 36 and the side legs 38 and 40 contact the bottom wall 42 and allow lines of magnetic flux to flow through the magnetic circuit. The material for the core 32 may be ACME™ P46.

Sandwiched between the upper and lower sections of the magnetic core 32 are multiple layers of a multilayer circuit board. As shown in FIG. 2, these layers include a first EMI shield 44, a second EMI shield 46 (although shown in this view as two separate layers because of the manner in which this board was fabricated, these shields can be referred to as a single, upper EMI shield 44/46), a first dielectric layer 48 (which may be relatively thicker than other layers for structural reasons), a copper layer 50 that is another EMI shield (note that each of the EMI shields has a slit missing from the opening to an exterior edge so that it does not act as a turn of a coil), a second dielectric layer 52, a first coil layer 54, a third dielectric layer 56, a second coil layer 58 (note that the first and second coil layer include coils that are wound in an opposite direction from each other so that when adjacent coil layers are connected together electrically between the layers, the connection can be made by blind buried vias at the interior of the coils or by edge connection along the exterior edge of the layers, in an alternating manner), a fourth dielectric layer 60, a third coil layer 62, a fifth dielectric layer 64, a fourth coil layer 66, a sixth dielectric layer 68, a fifth coil layer 70, a seventh dielectric layer 72, a sixth coil layer 74, an eighth dielectric layer 76, a seventh coil layer 78, a ninth dielectric layer 80, an eighth coil layer 82 (these first eight coil layers are connected together to create the primary winding), a tenth dielectric layer 84, a ninth coil layer 86, an eleventh dielectric layer 88, a tenth coil layer 90 (these latter two coil layers 86 and 90 are connected together to create an auxiliary winding), a twelfth dielectric layer 92, a third EMI shield 94, a thirteenth dielectric layer 96 that is significantly thicker than the second through twelfth dielectric layers 52, 56, 60, 64, 68, 72, 76, 80, 84, 88, and 92 to serve as a safety spacer, a plated layer 98 plated on top of an eleventh coil layer 100 (together these two layers can be referred to as coil layer 98/100), a fourteenth dielectric layer 102, a twelfth coil layer 104 onto which a plated layer 106 is provided (together these two layers can be referred to as coil layer 104/106), a fifteenth dielectric layer 108, a fourth EMI shield 110, and a fifth EMI shield 112 (together these shields can be referred to as a single, lower EMI shield 110/112). Note that the first, thirteenth, and fifteenth-dielectric layers 48, 96, and 108 may have a thickness in the range of 15 mils while the remaining dielectric layers 52, 56, 60, 64, 68, 72, 76, 80, 84, 88, 92, and 102 may have a thickness in the range of 3 mils. The copper layers 50 and 90 may have a thickness of approximately 1.2 mil. The plated layers 98 and 106 may have a thickness of approximately 1.0 mil.

Each of the layers 44-112 may have a central opening defined therein to receive the center leg 36 of the magnetic core. The first through ninth coil layers 54, 58, 62, 66, 70, 74, 78, 82, and 86 may be made of copper and may have a thickness of approximately 1.2 mils, while the eleventh and twelfth coil layers 100 and 104 may also be made of copper but may have a thickness of approximately 0.6 mils. The first and fifth EMI shields 44 and 112 may be plated and may have a thickness of approximately 1.2 mils, while the second, third, and fourth EMI shields 46, 94, and 110 may be made of copper and the second and fourth shields 46 and 110 may have a thickness of approximately 0.6 mils while the third shield 94 may have a thickness of approximately 1.2 mils.

As discussed above, the first through eighth coil layers 54, 58, 62, 66, 70, 74, 78, and 82 may be connected together to make up a primary winding while the coil layers 86 and 90 are connected together to make up an auxiliary winding, and the coil layers 98/100 and 102/104 may be connected together to make up a secondary winding. Such connections may be implemented with pass-through leads 45 in the board to interconnect selected ones of the coils.

As can be seen, there is an empty layer 96 added to produce adequate spacing between primary and secondary windings. Furthermore, the windings are inset from the edges of the PC board to provide adequate dielectric to satisfy safety requirements. A line 120 has been added to the drawing to show the outer edge of the circuit board. It can be seen that while the dielectric layers extend out to the line 120, the layers 98, 100, 104, and 106 making up the secondary coil do not extend out to the line 120. This spacing provides the adequate safety margin on the sides of the secondary winding. It should be appreciated that the "empty layer" may include traces, so long as the spacing requirements are met. In at least one embodiment, there is equal spacing between the windings and the edge of the board in all directions.

Figure 3:
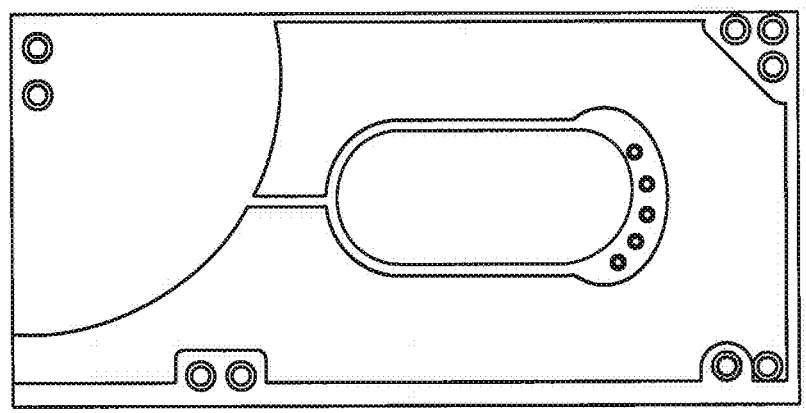
FIG. 3 shows the assembled multilayer circuit board of FIG. 2.
Figure 4:
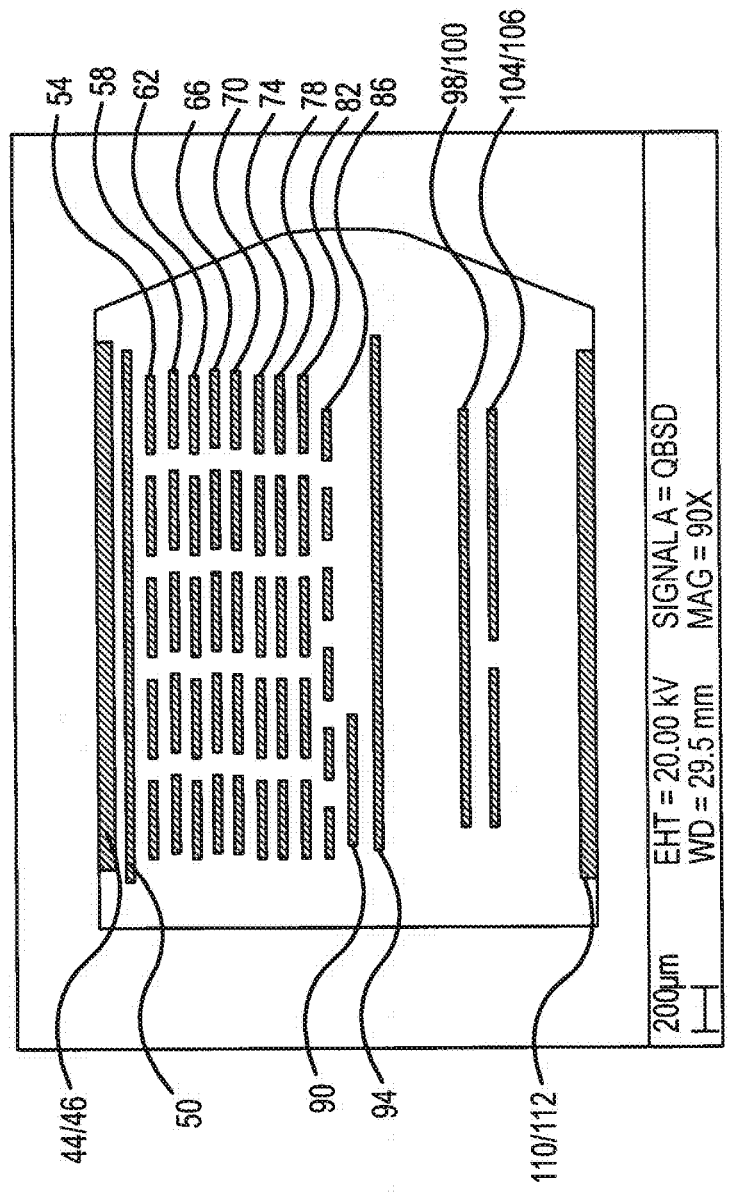
FIG. 4 shows a cross-sectional view of the assembled multilayer circuit board of FIG. 2.

FIG. 3 shows the assembled layers of the inductive element 10 without the core 32 in place. FIG. 4 shows a cross-sectional view of the assembled layers. As can be seen, the EMI shields 44/46, 50, 94, and 110/112 are clearly visible. Between the EMI shields 44/46 and 94, the various coil layers of the primary and auxiliary windings can be seen. Between the EMI shields 94 and 110/112, the coil layers 98/100 and 102/104 of the secondary winding can be seen. Sandwiched between each of these layers are the various dielectric layers. Note that the coil layers 98/100 and 102/104 of the secondary winding are somewhat thicker than those of the other windings. Further, as seen in FIG. 2, the conductive areas of layers 98/100 and 102/104 are extremely wide and have a slit separating them. This is in contrast to the relatively-narrow traces for the coil layers of the primary and auxiliary windings. This larger volume through which current can flow in the secondary windings is provided because the current which may pass through the secondary windings may be up to 2.5 amps as compared to up to approximately 0.4 amps in the primary winding.

It can also be appreciated that the primary winding (when all of the coil layers are connected together) may have approximately 40-42 turns, while the auxiliary winding may have 6-8 turns, and the secondary winding may have only approximately 3 turns.

As can be appreciated, the techniques taught herein provide for an easily and repeatably manufacturable design for an inductive element in a single multilayer circuit board. Further, this design provides an adequate safety layer between the primary and secondary windings. Lastly, the design provides an adequate safety layer on the periphery of each layer.

While the invention has been illustrated and described in detail in the drawings and foregoing description, such illustration and description is to be considered as exemplary and not restrictive in character. For example, certain embodiments described hereinabove may be combinable with other described embodiments and/or arranged in other ways (e.g., process elements may be performed in other sequences). Accordingly, it should be understood that only the preferred embodiment and variants thereof have been shown and described and that all changes and modifications that come within the spirit of the invention are desired to be protected.

What is claimed:

1. An inductive element, comprising:
a multilayer circuit board wherein each layer of the board includes a central opening defined therein, wherein:
a plurality of the layers in the board include a coil of conductive material thereon through which current can flow, and further wherein one or more of these coils constitute a primary winding and wherein one or more or more of these coils constitute a secondary winding and wherein the coils are provided within a central area on the layers of the board to provide an adequate safety margin along the side edges of the board;
a plurality of other layers in the board, each of the other layers being substantially similar in shape and size, wherein the plurality of other layers serve as dielectric layers to separate the coils from each other, and to separate the primary winding from the secondary winding by an adequate safety margin; and
pass-through leads in the board interconnect selected ones of the coils to create the primary and secondary windings; and
a magnetic core, a portion of which is received within the central opening in the board.

2. An inductive element as defined in claim 1, wherein a plurality of other layers constitute EMI shields.

3. An inductive element as defined in claim 1, wherein the primary winding is separated from the secondary winding by at least approximately 10 mils.

4. An inductive element as defined in claim 3, wherein the primary winding is separated from the secondary winding by at least approximately 14 mils.

5. An inductive element as defined in claim 4, wherein the plurality of coils of the primary winding are separated from each other by a dielectric layer having a thickness of less than approximately 5 mils.

6. An inductive element as defined in claim 5, wherein the plurality of coils of the primary winding are separated from each other by a dielectric layer having a thickness of approximately 3 mils or less.

7. An inductive element as defined in claim 1, wherein the multilayer circuit board is rectangular in shape with the rectangle having a length that is substantially greater than the width of the rectangle.

8. An inductive element as defined in claim 7, wherein the central opening is oval-shaped.

9. An inductive element as defined in claim 1, wherein the central opening is oval-shaped.

10. An inductive element as defined in claim 1, wherein one or more of the coils constitute an auxiliary winding.

* * * * *